(12) United States Patent
Choung et al.

(10) Patent No.: US 9,360,695 B2
(45) Date of Patent: Jun. 7, 2016

(54) LIQUID CRYSTAL DISPLAY

(71) Applicant: Samsung Display Co., Ltd., Yongin (KR)

(72) Inventors: Jong-Hyun Choung, Hwaseong-si (KR); Wang Woo Lee, Suwon-si (KR); Bong-Kyun Kim, Hwaseong-si (KR); In-Bae Kim, Yongin-si (KR); Seon-Il Kim, Seoul (KR); Young Min Moon, Seongnam-si (KR); Hong Sick Park, Suwon-si (KR); Ki Tae Kim, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 67 days.

(21) Appl. No.: 14/046,326

(22) Filed: Oct. 4, 2013

(65) Prior Publication Data

US 2014/0125904 A1 May 8, 2014

(30) Foreign Application Priority Data

Nov. 6, 2012 (KR) .................. 10-2012-0124719

(51) Int. Cl.
| | | |
|---|---|---|
| *G02F 1/1343* | (2006.01) | |
| *G02F 1/1333* | (2006.01) | |
| *G02F 1/1337* | (2006.01) | |
| *G02F 1/1362* | (2006.01) | |
| *G02F 1/1368* | (2006.01) | |
| *H01L 27/12* | (2006.01) | |

(52) U.S. Cl.
CPC ........ *G02F 1/133345* (2013.01); *G02F 1/1368* (2013.01); *G02F 1/133707* (2013.01);
(Continued)

(58) Field of Classification Search
CPC ............... G02F 1/134363; G02F 1/136286; G02F 1/1368; G02F 1/1362; G02F 1/136227; G02F 1/133345; G02F 1/134309; G02F 1/136209; G02F 1/1333; G02F 1/133514; G02F 1/134336; G02F 1/136204; G02F 2001/13629; G02F 2001/136222; G02F 2001/134318; G02F 2201/123; G02F 2201/50; G02F 1/1343; H01L 27/124; H01L 27/3262; H01L 27/3276; H01L 29/7869; H01L 29/458; H01L 29/78606; H01L 29/41733; H01L 29/42384; H01L 29/4908; H01L 29/786; H01L 29/78669; H01L 29/78678; H01L 21/02554; H01L 21/02565; H01L 21/02614; H01L 33/0041; G09G 2300/0434; G09G 2320/02
USPC ......... 257/43, 72, E21.414, E29.273, E21.02, 257/E29.151, E33.062; 349/43, 141, 138, 349/42, 110, 143, 187, 139, 33, 106, 349/145–147, 151, 149, 152; 438/104, 158, 438/151, 149; 345/87, 92
See application file for complete search history.

(56) References Cited

U.S. PATENT DOCUMENTS 5,754,266 A * 5/1998 Ohta et al. .................... 349/139
7,560,316 B2 7/2009 Heo et al.
(Continued)

FOREIGN PATENT DOCUMENTS

| | | |
|---|---|---|
| JP | 2000-180891 | 6/2000 |
| JP | 2005-026690 | 1/2005 |

(Continued)

*Primary Examiner* — Thoi Duong
(74) *Attorney, Agent, or Firm* — H.C. Park & Associates, PLC

(57) ABSTRACT

A liquid crystal display includes: a substrate; a gate line and a data line disposed on the substrate; a semiconductor layer disposed on the substrate; first and second field generating electrodes disposed on the substrate; and a first protecting layer formed from the same layer as the first field generating electrode and covering at least a portion of the data line.

19 Claims, 8 Drawing Sheets

(52) U.S. Cl.
CPC ..... *G02F1/134363* (2013.01); *G02F 1/136259* (2013.01); *G02F 2001/134372* (2013.01); *G02F 2001/136231* (2013.01); *G02F 2001/136295* (2013.01); *G02F 2201/124* (2013.01); *H01L 27/1225* (2013.01)

(56) References Cited

U.S. PATENT DOCUMENTS

| | | | |
|---|---|---|---|
| 8,318,551 B2 * | 11/2012 | Akimoto et al. | 438/158 |
| 2002/0033907 A1 * | 3/2002 | Oke | G02F 1/136286 349/46 |
| 2002/0051101 A1 * | 5/2002 | Kurahashi et al. | 349/43 |
| 2003/0231149 A1 * | 12/2003 | Kawamura et al. | 345/76 |
| 2010/0187532 A1 * | 7/2010 | Nagano | G02F 1/136286 257/59 |

FOREIGN PATENT DOCUMENTS

| | | |
|---|---|---|
| JP | 2008-090309 | 4/2008 |
| KR | 10-2002-0071643 | 9/2002 |
| KR | 10-2008-0021863 | 3/2008 |
| KR | 10-2008-0030873 | 4/2008 |
| KR | 10-2008-0035045 | 4/2008 |
| KR | 10-2009-0008535 | 1/2009 |
| KR | 10-2011-0128038 | 11/2011 |

* cited by examiner

LIQUID CRYSTAL DISPLAY

CROSS-REFERENCE TO RELATED APPLICATION

This application claims priority to and the benefit of Korean Patent Application No. 10-2012-0124719, filed on Nov. 6, 2012, which is hereby incorporated by reference for all purposes as if fully set forth herein.

BACKGROUND

1. Field

Exemplary embodiments of the present invention relate to a liquid crystal display.

2. Discussion of the Background

A liquid crystal display is one of the most widely used types of flat panel displays. A liquid crystal display is a display device that controls the amount of light passing through a liquid crystal layer by applying a voltage to electrodes to rearrange liquid crystal molecules of the liquid crystal layer.

A liquid crystal display may be formed to be thin, but may have a limited viewing angle. In order to overcome this drawback, various types of liquid crystal arranging and driving methods have been developed. As a method for implementing a wide viewing angle, much attention is being paid to a liquid crystal display in which two field generating electrodes are formed in one substrate.

A display device typically includes a thin film transistor for switching each pixel. The thin film transistor is a switching element having three terminals, which include a gate electrode configured to receive a switching signal, a source electrode configured to receive a data voltage, and a drain electrode configured to output a data voltage. Further, the thin film transistor includes an active layer as a channel layer, with the active layer overlapping the gate electrode, the source electrode, and the drain electrode. The active layer is usually made of amorphous silicon as a semiconductor material.

However, with the increase in display size, the development of thin film transistors which can be driven at ultra-high speed is needed. Particularly, amorphous silicon, which is usually used as the active layer, has a low electron mobility and requires expensive deposition equipment based on a vacuum process, for applying a chemical vapor deposition (CVD) method, a sputtering method, or the like.

Therefore, research is being conducted on the development of an oxide semiconductor that has a high electron mobility and can be subjected to a solution process, to perform a coating process or an ultra-low-cost printing process. Further, the necessity for a method which forms a wire using a metal with a low resistance, to increase current transfer speed, is gradually increasing.

However, when a data conductor such as a data wire or an electrode of a thin film transistor is formed of a metal with a low resistance, the data conductor may be oxidized by an insulating layer formed over the data conductor. In order to prevent the oxidation, a method of forming a data conductor as double layers or triple layers having different physical properties has been proposed. However, even when the data conductor is formed as double layers or triple layers, the side surface of a metal with a low resistance may be exposed, and even the top surface of a layer made of a metal with a low resistance may be exposed because the double layers or triple layers are etched at different speeds. Therefore, it is difficult to prevent the oxidization of the low resistance data conductor.

Further, as the channel length of a thin film transistor decreases, the characteristics of the thin film transistor are improved. During a process of patterning a semiconductor, an input electrode, and an output electrode, using one exposure mask, it is difficult to accurately control a height difference between photosensitive film patterns. Therefore, there is a limitation in reducing a distance between the input electrode and the output electrode.

The above information disclosed in this Background section is only for enhancement of understanding of the background of the invention and, therefore, it may contain information that does not constitute prior art.

SUMMARY OF THE INVENTION

Exemplary embodiments of the present invention provide a liquid crystal display capable of using an oxide semiconductor, forming input and output electrodes of a thin film transistor using a metal with a low resistance, and preventing oxidization of the metal.

Additional features of the invention will be set forth in the description which follows, and in part will be apparent from the description, or may be learned by practice of the invention.

An exemplary embodiment of the present invention provides a liquid crystal display including: a substrate; a gate line and a data line positioned over the substrate; a semiconductor layer positioned over the substrate; first and second field generating electrodes positioned over the substrate; and a first protecting layer formed as the same layer as the first field generating electrode and covering at least a part of the data line.

The semiconductor layer may include an oxide semiconductor.

The first protecting layer may include a transparent insulating layer whose indium oxide content ranges from about 10 wt % to about 50 wt %.

The liquid crystal display may further include an insulating layer covering the semiconductor. The insulating layer may include silicon oxide.

The liquid crystal display may further include a source electrode overlapping the semiconductor and connected to the data line; and a drain electrode overlapping the semiconductor and facing the source electrode. The first protecting layer may include a first portion covering the source electrode and a second portion covering the drain electrode.

A distance between the source electrode and the drain electrode may be larger than a distance between the first and second portions of the first protecting layer.

The data line may include a low-resistance metal.

The insulation substrate may include a display area including a plurality of pixels and a peripheral area around the display area. The liquid crystal display may further include: a first signal transmitting line and a second driving signal transmitting line positioned in the peripheral area of the insulation substrate; and a second protecting layer formed as the same layer as the first field generating electrode and covering at least a part of the second driving signal transmitting line.

The liquid crystal display may further include a driving semiconductor positioned in the peripheral area; a driving input electrode and a driving output electrode overlapping the driving semiconductor; and a third protecting layer covering the driving input electrode; and a fourth protecting layer covering the driving output electrode. The third protecting layer and the fourth protecting layer may be formed as the same layer as the first field generating electrode.

A distance between the driving input electrode and the driving output electrode may be larger than a distance between the third protecting layer and the fourth protecting layer.

The first and second field generating electrodes may overlap each other with an insulating layer interposed therebetween.

At least one of the first field generating electrode and the second field generating electrode may include a plurality of branch electrodes.

According to various embodiments, at least a portion of the data conductor is covered and protected by the cover layer formed from the same layer as the first field generating electrode. Accordingly, it is possible to prevent oxidation of the source electrode and the drain electrode by the passivation layer. Further, as the side surfaces of the source and drain electrodes are covered by the cover layer, the minimum distance between the source and drain electrodes may be reduced. Therefore, the channel length of the thin film transistor may be reduced, which may improve the performance of the thin film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
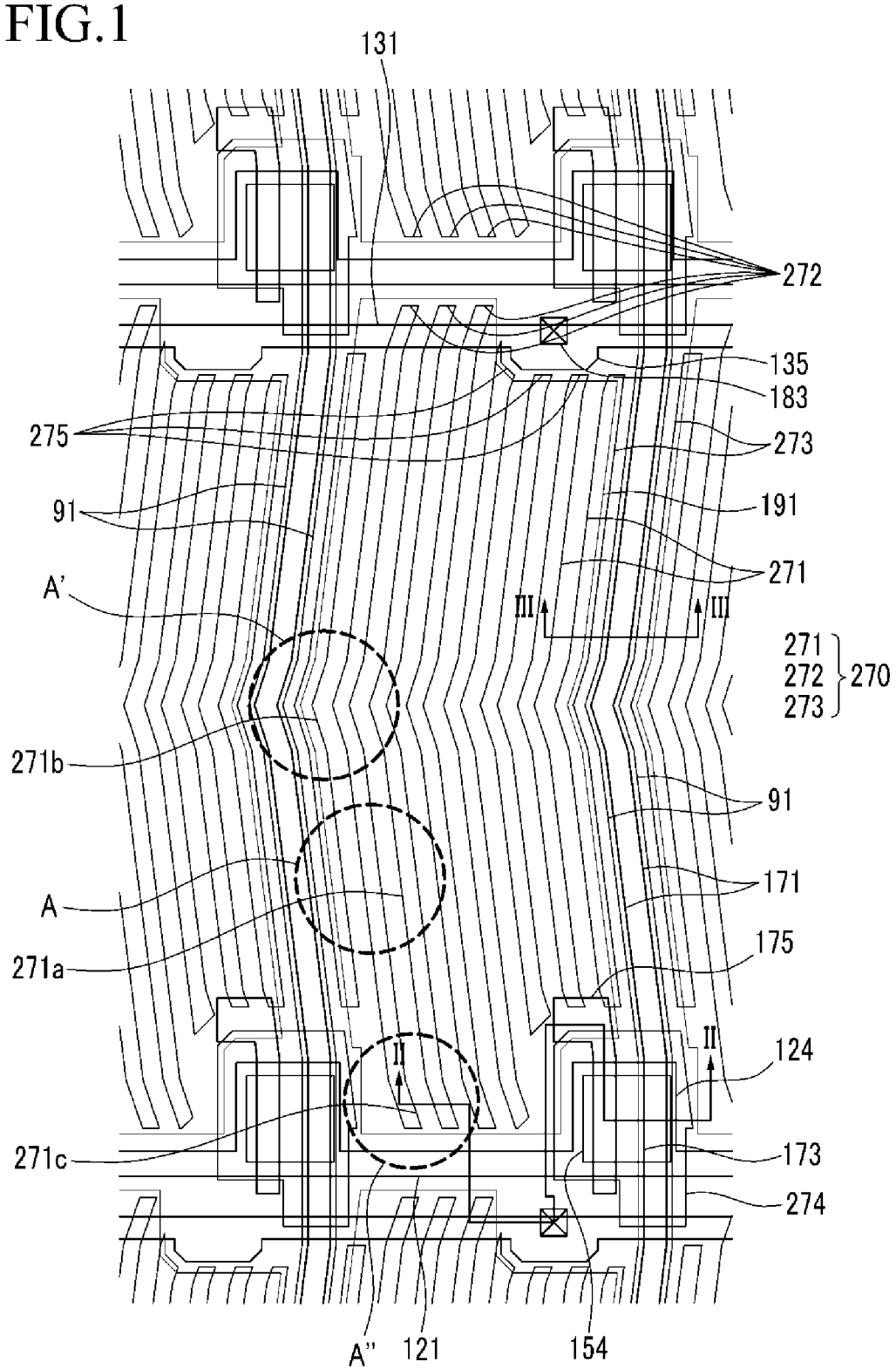
FIG. 1 is a layout view of a liquid crystal display according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
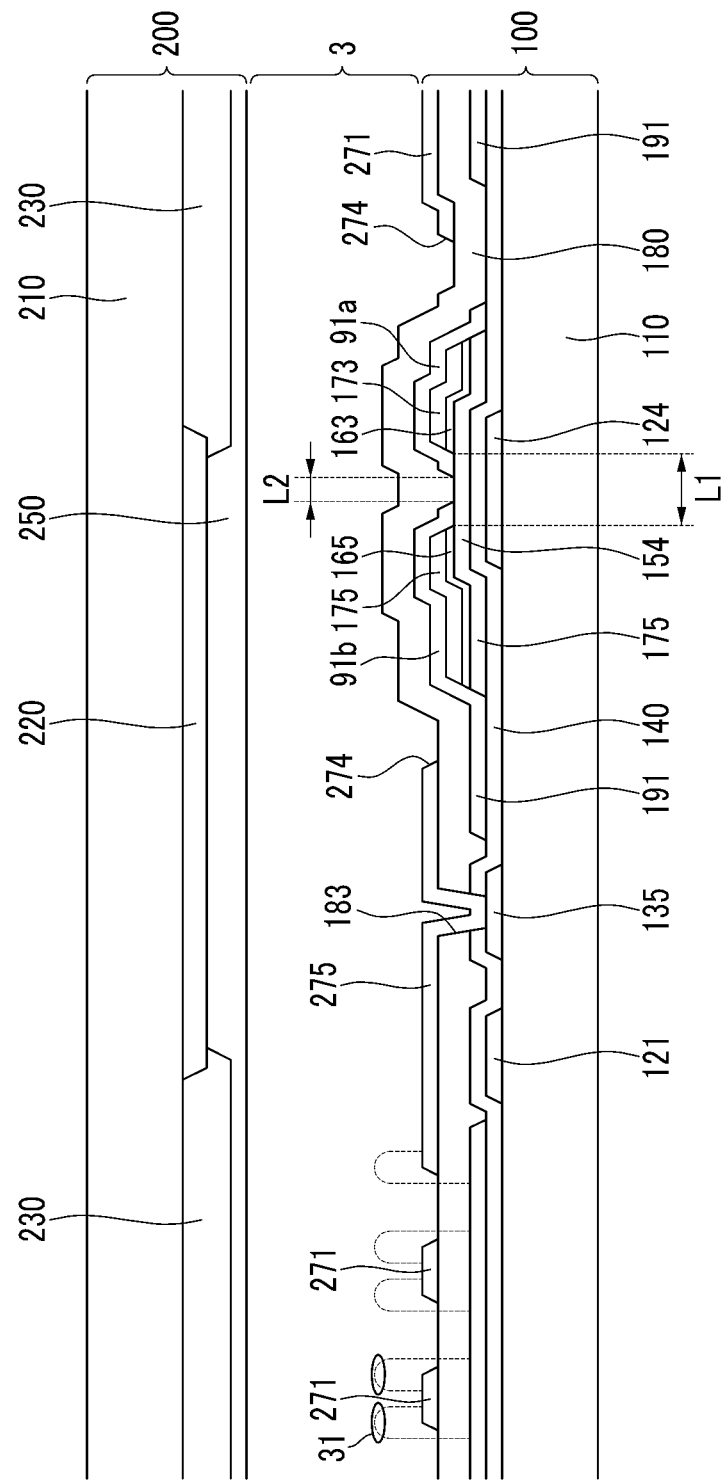
FIG. 2 is a cross-sectional view of the liquid crystal display of FIG. 1, taken along line II-II.
Figure 3:
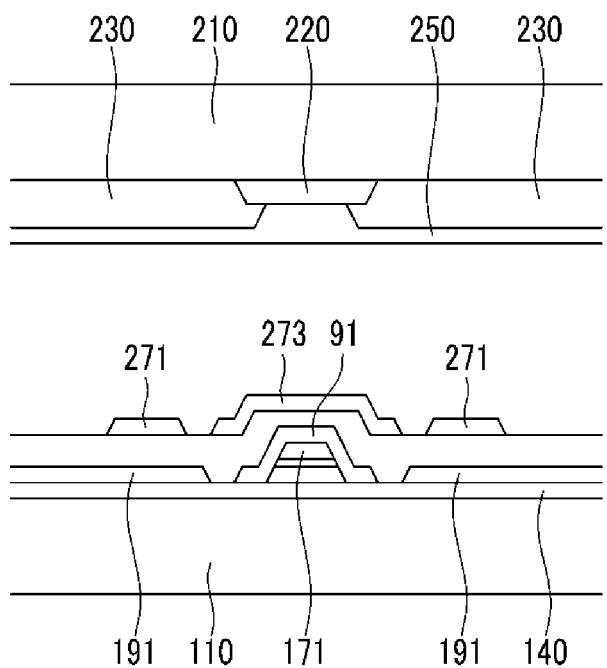
FIG. 3 is a cross-sectional view of the liquid crystal display of FIG. 1, taken along line III-III.

FIG. 1 is a layout view showing one pixel of a liquid crystal display, according to an exemplary embodiment of the present invention. The area in which the pixel is disposed may be referred to as a pixel area. FIG. 2 is a cross-sectional view of the liquid crystal display of FIG. 1, taken along line II-II, and FIG. 3 is a cross-sectional view of the liquid crystal display of FIG. 1, taken along line III-III.

Referring to FIGS. 1 and 2, the liquid crystal display includes a thin film transistor array panel 100, an upper panel 200, and a liquid crystal layer 3. The thin film transistor array panel 100 and the upper panel 200 face each other, and the liquid crystal layer 3 is injected between the display panels 100 and 200.

The thin film transistor array panel 100 includes a gate conductor including a gate line 121. A reference voltage line 131 is formed over a first substrate 110 made of transparent glass or plastic. The gate line 121 includes a gate electrode 124 and a wide end portion (not shown) for connection to another layer or an external driving circuit. The gate line 121 may be made of an aluminum (Al)-based metal such as Al or Al alloy, a silver (Ag)-based metal such as Ag or Ag alloy, a copper (Cu)-based metal such as Cu or Cu alloy, a molybdenum (Mo)-based metal such as Mo or Mo alloy, chrome (Cr), tantalum (Ta), or titanium (Ti). However, the gate line 121 may have a multilayer structure including at least two conductive layers having different physical properties.

A reference voltage line 131 transmits a constant reference voltage, and includes an expanded portion 135 for connection to a second field generating electrode 270 described below. The reference voltage line 131 is connected to the second field generating electrode 270 and transmits the reference voltage to the second field generating electrode 270. The reference voltage line 131 may be parallel to the gate line 121 and may be made of the same material as the gate line 121.

A gate insulating layer 140 made of silicon nitride ($SiN_x$) or silicon oxide ($SiO_x$) is formed on the gate conductor 121 and reference voltage line 131. The gate insulating layer 140 may have a multilayer structure including at least two insulating layers having different physical properties.

A semiconductor 154 including amorphous silicon or polysilicon is formed on the gate insulating layer 140. The semiconductor 154 overlaps at least a part of the gate electrode 124.

The semiconductor 154 may include an oxide semiconductor. The oxide semiconductor may include an oxide of zinc (Zn), gallium (Ga), tin (Sn), or indium (In). For example, the oxide semiconductor may include zinc oxide (ZnO), In—Ga—Zn oxide ($InGaZnO_4$), Zn—In oxide (Zn—In—O), or Zn—Sn oxide (Zn—Sn—O). The oxide semiconductor 154 may be formed by a solution process such as an inkjet process. Specifically, the semiconductor 154 may be an oxide semiconductor such as IGZO (In—Ga—Zn—O), GZO (Ga—Zn—O), IZO (In—Zn—O) or HIZO (Hf—In—Zn—O).

A first barrier layer 163 and a second barrier layer 165 are formed on the semiconductor 154. The first barrier layer 163 and the second barrier layer 165 may serve to increase a contact characteristic (reduce contact resistance) between the semiconductor 154, and a source electrode 173 and a drain electrode 175, and may prevent a metal component of the source electrode 173 and the drain electrode 175 from diffusing into the semiconductor 154. Therefore, it is possible to prevent the characteristics of the semiconductor 154 from being degraded. The first barrier layer 163 and the second barrier layer 165 may include an oxide semiconductor. For example, when the semiconductor 154 is made of IGZO (In—Ga—Zn—O), the first barrier layer 163 and the second barrier layer 165 may be made of IZO (In—Zn—O).

A data conductor, including a data line 171 including the source electrode 173 and the drain electrode 175, is formed over the first barrier layer 163, the second barrier layer 165, and the gate insulating layer 140.

The data line 171 includes a wide end portion (not shown) for connection to another layer or an external driving circuit. The data line 171 transmits a data signal and extends in a vertical direction, so as to cross the gate line 121 and the reference voltage line 131. The data line 171 and the gate line 121 form the pixel area. Here, the data line 171 may have first bent portions to increase transmittance of the liquid crystal display. The first bent portions may meet each other in an intermediate region (within A') of the pixel area, so as to form a V-shape. The data line 171 may further include a second bent portion in the intermediate region of the pixel area. The second bent portion forms a predetermined angle with respect to the first bent portion.

The first bent portion of the data line 171 may form an angle of about 7° with respect to a rubbing direction of an alignment layer to be described below. The second bent portion disposed in the intermediate region of the pixel area may form an angle of about 7° to about 15° with respect to the first curved portion.

The source electrode 173 is a part of the data line 171. The drain electrode 175 is formed to extend in parallel to the source electrode 173. Therefore, the drain electrode 175 is parallel to a part of the data line 171.

The data line 171 and the drain electrode 175 may be made of a Cu-based metal such as Cu or Cu alloy, an Al-based metal such as Al or Al alloy, or an Ag-based metal such as Ag or Ag alloy, having low resistance.

The semiconductor 154, the first barrier layer 163, the second barrier layer 165, the data line 171, the drain electrode 175 may be formed in one photolithography process using one exposure mask. The semiconductor 154 has substantially the same planar shape as the data line 171 and the drain electrode 175, and may have substantially the same planar shape as the first barrier layer 163 and the second barrier layer 165 disposed under the data line 171 and the drain electrode 175. However, a portion of the semiconductor 154 is exposed between (not covered by) the source electrode 173 and the drain electrode 175.

The gate electrode 124, the source electrode 173, and the drain electrode 175 form one thin film transistor (TFT) in conjunction with the semiconductor 154. The channel of the semiconductor 154 is disposed between the source electrode 173 and the drain electrode 175.

The source electrode 173 is positioned on the same line as the data line 171 and the drain electrode 175. Therefore, the width of the thin film transistor may be increased without increasing an area occupied by the data conductor. Accordingly, the aperture ratio of the liquid crystal display may be increased.

The first field generating electrode 191 and a first protecting layer 91 (91a and 91b) are formed over portions of the drain electrode 175 and the gate insulating layer 140.

The first field generating electrode 191 has a plate shape including two bent edges and two horizontal edges. The bent edges are substantially parallel to the first and second bent portions of the data line 171. The horizontal edges connect the bent edges.

The first field generating electrode 191 covers a portion of the drain electrode 175. The first field generating electrode 191 is physically (directly) and electrically connected to the drain electrode 175.

The first protecting layer 91 includes a first portion 91a and a second portion 91b. The first portion 91a covers portions of the data line 171 and the source electrode 173, and the second portion 91b covers a portion of the drain electrode 175. The second portion 91b may be omitted.

The second portion 91b of the first protecting layer 91 is shown as being connected to the first field generating electrode 191. However, the second portion 91b of the first protecting layer 91 may be separated from the first field generating electrode 191. The first protecting layer 91 and the first field generating electrode 191 may be simultaneously formed from the same layer.

The first field generating electrode 191 and the first protecting layer 91 may be made of a transparent conductive material such as polycrystal, single-crystal, or amorphous indium tin oxide (ITO) or indium zinc oxide (IZO). The content of the indium oxide ($InO_x$) may be set in the range of about 10 wt % to about 50 wt %, based on the total weight of the first field generating electrode 191 and/or the first protecting layer 91.

When the content of $InO_x$ ranges from about 10 wt % to about 50 wt %, the first field generating electrode 191 and the first protecting layer 91 may have a different etch ratio than the exposed semiconductor 154. Therefore, the first field generating electrode 191 and the first protecting layer 91 may be formed without damaging the semiconductor 154.

In the thin film transistor array panel 100, the side surfaces of the source electrode 173 and the drain electrode 175 are separated from each other and are covered and protected by the first protecting layer 91. Therefore, a first distance L1 between the source electrode 173 and the drain electrode 175 may be larger than a second distance L2 between the first portion 91a and the second portion 91b. Accordingly, an actual channel length of the semiconductor 154 corresponds to the second distance L2, which is smaller than the first distance L1 between the source electrode 173 and the drain electrode 175. When one exposure mask is used to pattern the semiconductor 154, the source electrode 173, and the drain electrode 175, it may be difficult to obtain a small separation between the source electrode 173 and the drain electrode 175. However, when the side surfaces of the source electrode 173 and the drain electrode 175 are covered by the first protecting layer 91, the actual channel length of the thin film transistor may be reduced. Accordingly, the performance of the thin film transistor may be improved.

As shown in FIG. 3, the first protecting layer 91 covers the data line 171. Therefore, if a defect occurs during a manufacturing process for the data line 171, for example, the width of the data line 171 is reduced or a disconnection occurs, a defect of the data line 171 may be prevented because the first protecting layer 91 covers the data line 171. That is, a data signal transmitted through the data line 171 may be transmitted through the first protecting layer 91. Therefore, a defect occurring during the manufacturing process may be remedied without an additional repair step.

Referring again to FIGS. 1 and 2, a passivation layer 180 is formed over the data conductors 171 and 175, the exposed semiconductor 154, and the first field generating electrode 191. The passivation layer 180 may be made of an insulating material such as silicon oxide ($SiO_x$). According to some embodiments, the passivation layer 180 may have a dual-layer structure including a first passivation layer and a second passivation layer disposed on the first passivation layer. The first passivation layer contacts the channel region of the oxide semiconductor 154. The first passivation layer may include silicon oxide ($SiO_x$), and the second passivation layer may include an inorganic insulator such as silicon nitride ($SiN_x$) or an organic insulator. Since the passivation layer 180 contacts the channel region of the oxide semiconductor 154, an oxygen deficiency within the semiconductor 154 may be prevented, which makes it possible to prevent a corresponding degradation of the channel layer.

As such, the liquid crystal display includes the semiconductor 154 made of an oxide semiconductor and the source electrode 173 and the drain electrode 175 positioned on the semiconductor 154, and the passivation layer 180 covering the semiconductor 154 is stacked as silicon oxide. The first protecting layer 91 covers and protects the data line 171, the source electrode 173, and the drain electrode 175. Therefore, the data line 171, the source electrode 173, and the drain electrode 175, which are made of a low resistance metal, do not directly contact the passivation layer 180, which is made of silicon oxide. Therefore, it is possible to prevent oxidization that may occur when the data line 171 and the source electrode 173 and the drain electrode 175 react with the passivation layer 180. Accordingly, it is possible to prevent corrosion caused by oxidization.

The passivation layer 180 has a contact hole (not shown) exposing an end portion of the data line 171. The passivation layer 180 and the gate insulating layer 140 have a contact hole 183 exposing a connection portion 135 of the reference voltage line 131, and a contact hole (not shown) exposing an end portion of the gate line 121.

A second field generating electrode 270 is formed on the passivation layer 180. The second field generating electrode 270 overlaps the first field generating electrode 191, and includes a plurality of branch electrodes 271, a lateral connection portion 272, and a vertical connection portion 273. The lateral connection portion 272 connects the plurality of branch electrodes 271, and the vertical connection portion 273 connects the lateral connection portions 272. The second field generating electrode 270 may be made of a transparent conductive material, such as a polycrystal, single-crystal, or amorphous, indium tin oxide (ITO) or indium zinc oxide (IZO). The second field generating electrodes 270 disposed in adjacent pixels are connected to each other.

The branch electrode 271 includes first and second portions 271a and 271b (refer to A and A') that are parallel to the above-described first and second bent portions of the data line 171, respectively. The second portion 271b may form an angle of about 7° to about 15° with respect to the first portion 271a.

The lateral connection portion 272 of the second field generating electrode 270 is substantially parallel to the gate line 121, and connects the branch electrodes 271 at the top and bottom thereof. The lateral connection portion 272 has a first opening 274 disposed in a lower portion of the pixel area, which exposes the gate electrode 124, the semiconductor 154, the data line 171, the drain electrode 175, and a part of the reference voltage line 131. The lateral connection portion 272 has a reference electrode-expanded portion 275 extending toward the expanded portion 135 of the reference voltage line 131. The second field generating electrodes 270 disposed in adjacent pixels are connected to each other.

The branch electrode 271 of the second field generating electrode 270 further includes a third portion 271c (refer to A") that is bent at a predetermined angle. The third portion 271c is connected to the lateral connection portion 272 of the second field generating electrode 270. The third portion 271c may be bent to form an angle of about 7° to about 15° with respect to the first portion 271a. That is, the acute angle formed between the lateral connection portion 272 and the first portion 271a is larger by about 7° to about 15° than the acute angle formed between the lateral connection portion 272 and the second portion 271b, or the acute angle formed between the lateral connection portion 272 and the third portion 271c.

The vertical connection portion 273 of the second field generating electrode 270 extends over a portion of the data line 171 disposed between two adjacent pixels. The vertical connection portion 273 has the first opening 274 disposed over the data line 171.

The expanded portion 275 of the second field generating electrode 270 is physically and electrically connected to the reference voltage line 131, through the contract hole 183 formed in the passivation layer 180 and the gate insulating layer 140. Although not shown, an alignment layer is disposed on the second field generating electrode 270 and the passivation layer 180. The alignment layer may be a horizontal alignment layer, and is rubbed in a predetermined direction.

Referring to the upper panel 200, a light blocking member 220 is formed on the second substrate 210, which is made of transparent glass or plastic. The light blocking member 220 may be referred to as a black matrix, and serves to block light leakage.

Color filters 230 are also formed on the substrate 210. Most of the color filters 230 are disposed within a region surrounded by the light blocking member 220, and may extend in a vertical direction along the column of the first field generating electrodes 191. Each of the color filters 230 may display one primary color, such as red, green, or blue.

An overcoat 250 is formed on the color filters 230 and the light blocking member 220. The overcoat 250 may be made of an (organic) insulator, and serves to prevent the color filters 230 from being exposed and provide a flat surface. The overcoat 250 may be omitted.

The liquid crystal layer 3 includes a nematic liquid crystal material having a positive dielectric anisotropy. The liquid crystal molecules of the liquid crystal layer 3 have a major-axis direction parallel to the display panels 100 and 220, and the direction is twisted 90 degrees in a spiral shape with respect to the rubbing direction of the alignment layer of the thin film transistor array panel 100 or the upper display panel 200.

The first field generating electrode 191 receives a data voltage from the drain electrode 175, and the second field generating electrode 270 receives the constant reference voltage from the reference voltage line 131. The second field generating electrodes 270 are connected to each other and receive the reference voltage from a reference voltage application unit disposed outside the display area. In order to prevent a voltage drop or the like within the display area, the second field generating electrodes 270 may receive reference voltages having the same magnitude from the reference voltage line 131.

The first field generating electrode 191 receives the data voltage while the second field generating electrode 270 receives the reference voltage, in order to generate electric fields, such that the liquid crystal molecules of the liquid crystal layer 3 positioned over the two electrodes 191 and 270 rotate in a direction parallel to the directions of the electric fields. Depending on the rotational direction of the liquid crystal molecules, polarization of light passing through the liquid crystal layer differs.

As such, the liquid crystal modules 31 are rotated by the electric field formed between the first field generating electrode 191 and an edge of a branch portion 271 of the second field generating electrode 270.

In the above embodiment, it has been described that the data voltage is applied to the first field generating electrode 191 and the reference voltage is applied to the second field generating electrode 270. However, the reference voltage may be applied to the first field generating electrode, and the data voltage may be applied to the second field generating electrode. In the exemplary embodiment, in which the reference voltage is applied to the first field generating electrode 191 and the data voltage is applied to the second field generating electrode 270, the second field generating electrode 270 is connected to the drain electrode 175 of the thin film transistor.

The thin film transistor array panel 100 includes the semiconductor 154 made of an oxide semiconductor and the source electrode 173 and the drain electrode 175 positioned on the semiconductor 154. The source electrode 173 and the drain electrode 175 are covered and protected by the first protecting layer 91, and then the passivation layer 180 is stacked on the first protecting layer 91. Therefore, since the data line 171, the source electrode 173, and the drain electrode 175 do not contact the passivation layer 180 made of silicon oxide, it is possible to prevent oxidization which may occur due to a reaction with the passivation layer 180. Accordingly, it is possible to prevent corrosion caused by oxidization.

Further, the source electrode 173 and the drain electrode 175 are covered and protected by the first protecting layer 91. Therefore, the first distance L1 between the source electrode 173 and the drain electrode 175 is set to be larger than the second distance L2 between the first portion 91a of the first protecting layer 91 and the second portion 91b of the first protecting layer 91. Therefore, the actual channel length of the semiconductor 154 corresponds to the second distance L2, which is smaller than the first distance L1. When one exposure mask is used to pattern the semiconductor 154, the source electrode 173, and the drain electrode 175, it may be difficult to obtain a small distance between the source electrode 173 and the drain electrode 175. However, as the side surfaces of the source electrode 173 and the drain electrode 175 are covered by the first protecting layer 91, the actual channel length of the semiconductor 154 may be reduced. Accordingly, the performance of the thin film transistor may be improved.

Further, the first protecting layer 91 covers the data line 171. Therefore, if a defect occurs during a manufacturing process of the data line 171, such as reduction in width of the data line 171 or a disconnection, it is possible to prevent repair the data line 171, because the first protecting layer 91 covers the data line 171. That is, a data signal transmitted through the data line 171 may be transmitted through the first protecting layer 91. Therefore, it is possible to repair a defect occurring during the manufacturing process, without an addition repair step.

The first field generating electrode 191 is disposed between the gate insulating layer 140 and the passivation layer 180, and covers a part of the drain electrode 175, so as to be physically and electrically connected to the drain electrode 175. Therefore, the aperture ratio of the liquid crystal display is increased, as compared with a conventional liquid crystal display, in which the first field generating electrode is connected through the contact hole.

Further, the source electrode 173 is positioned on the same line as the data line 171 and the drain electrode 175, which extend parallel to a part of the data line 171. Therefore, the width of the thin film transistor may be increased without increasing an area occupied by the data conductor. Accordingly, the aperture ratio of the liquid crystal display may be increased.

Further, the second field generating electrode 270 disposed on the passivation layer 180 has the opening 274 exposing portions of the gate electrode 124, the semiconductor 154, the source electrode 173, and the drain electrode 175. Therefore, it is possible to reduce parasitic capacitance between the data line 171 and the second field generating electrode 270.

Figure 4A:
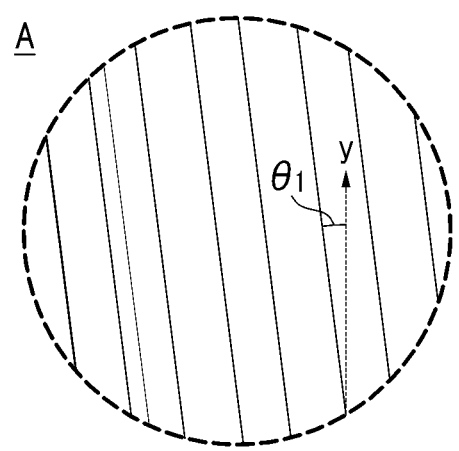
FIGS. 4A, 4B, and 4C are enlarged views of portions A, A', and A" of FIG. 1, respectively.
Figure 4B:
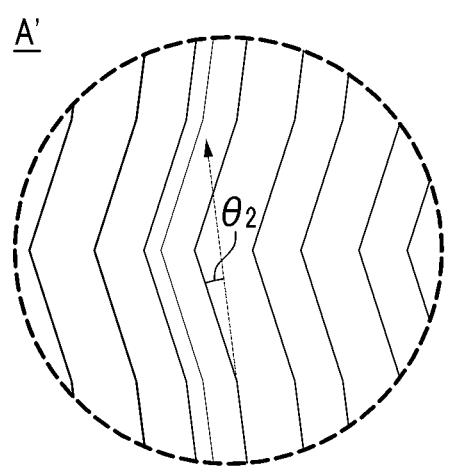
Figure 4C:
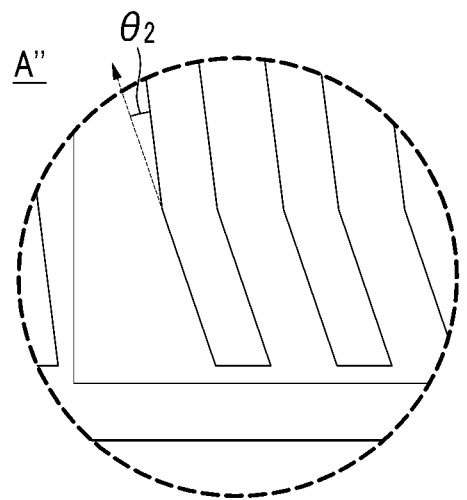

Now, the shape of the liquid crystal display according to the exemplary embodiment of the present invention will be described with reference to FIGS. 4A, 4B, and 4C. FIGS. 4A, 4B, and 4C illustrate portions A, A', and A" of the liquid crystal display of FIG. 1. Referring to FIG. 4A, the first portion 271a of the branch electrode 271 of the second field generating electrode 270 is inclined to form a first angle θ1, with respect to a vertical reference line y. As described above, the first angle θ1 may be set in the range of about 5° to about 10°. More specifically, the first angle θ1 may be set to about 7°.

Referring to FIG. 4B, the second portion 271a of the branch electrode 271 of the second field generating electrode 270 is bent to form a second angle θ2, with respect to the first portion 271a. Referring to FIG. 4C, the third portion 271c of the second field generating electrode 270 is bent to form the second angle θ2 with the first portion 271a. The second angle θ2 may be set in the range of about 7° to about 15°.

Since the branch electrode 271 of the second field generating electrode 270 is divided into the first portion 271a, the second portion 271b, and the third portion 271c, the generation direction of the electric field at the central portion and the edge portion of the pixel area may be changed. In general, the direction of an electric field at the end portion of the branch electrode 271 is different from that at the central portion of the branch electrode 271. Therefore, when the electric field is applied to the liquid crystal layer 3, the rotation direction of liquid crystal may become irregular. In this case, a texture may occur.

However, the liquid crystal display according to the exemplary embodiment of the present invention includes the second and third portions 271b and 271c disposed at the end of the first portion 271a of the branch electrode 271 and bent at a larger angle than the first portion 271a. Accordingly, the direction of the electric field applied to the liquid crystal layer 3 may be changed to rotate the liquid crystal molecules of the liquid crystal layer 3 in a predetermined direction. Further, since the liquid crystal display includes the second and third portions 271b and 271c bent at a larger angle than the first portion 271a, the rotation direction of the liquid crystal molecules 31 may be determined when the liquid crystal molecules 31 are rotated. Therefore, it is possible to prevent a texture caused by irregular rotations of the liquid crystal molecules 31 in the central portion of the pixel area or the top and bottom boundaries of the pixel area. Further, since the branch electrode 271 of the second field generating electrode 270 is divided into the first portion 271a, the second portion 271b, and the third portion 271c, the liquid crystal molecules 31 adjacent thereto may be rotated at different angles. Therefore, the viewing angle of the liquid crystal display may be increased, and the color tone thereof may be corrected.

Further, when external pressure or the like is applied to the second portion 271b and the third portion 271c of the branch electrode 271, the liquid crystal molecules which become disposed in irregular orientations may be prevented from spreading to the first portion 271a of the branch electrode 271.

Specifically, the irregular orientations the liquid crystal molecules, which occur in the second portion 271b and the third portion 271c, do not spread to the boundary with the first portion 271a of the branch electrode 271. Therefore, it is possible to prevent bruising caused by the external pressure.

Figure 5:
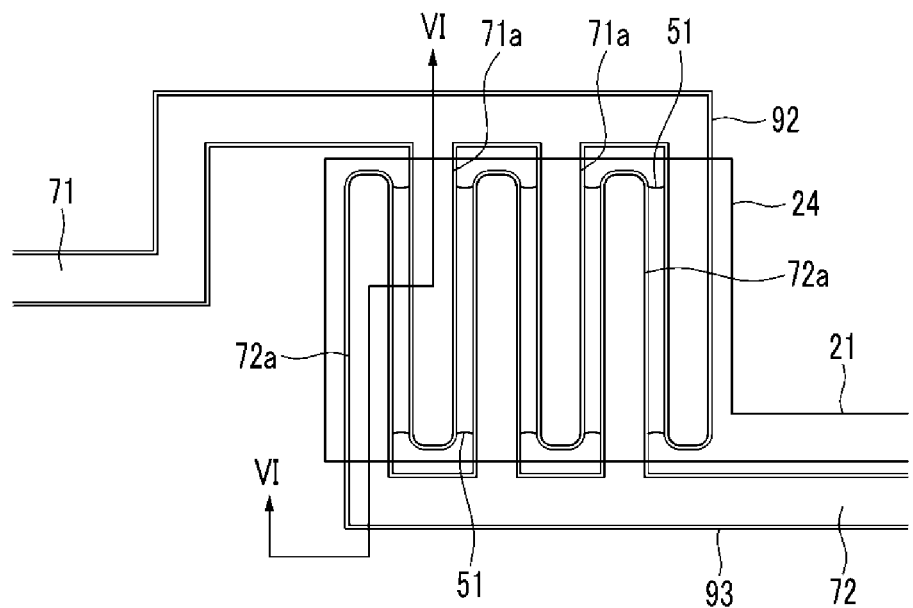
FIG. 5 is a layout view of a driving transistor of a driving unit in a thin film transistor array panel of the liquid crystal display, according to an exemplary embodiment of the present invention.
Figure 6:
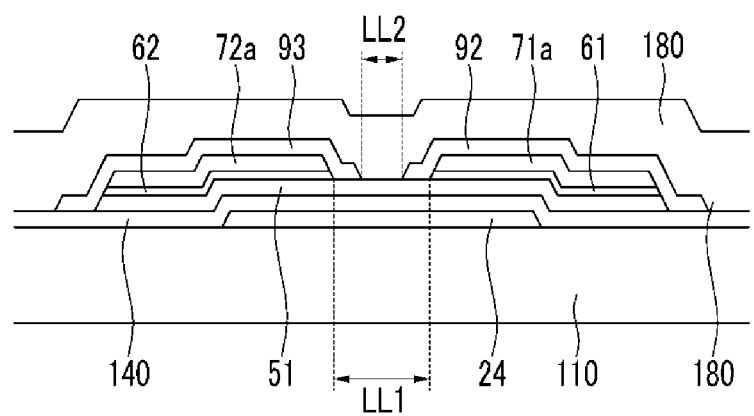
FIG. 6 is a cross-sectional view of the thin film transistor array panel of FIG. 5, taken along line VI-VI.
Figure 7:
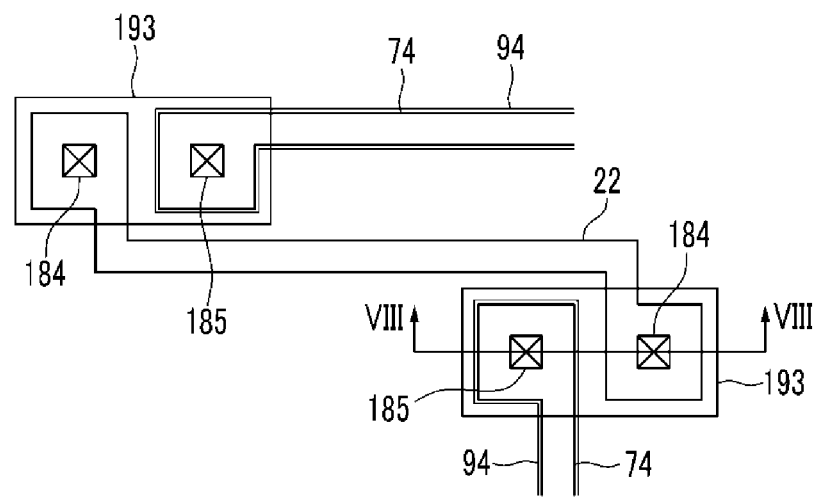
FIG. 7 is a layout view showing signal lines of the driving unit in the thin film transistor array panel of the liquid crystal display, according to an exemplary embodiment of the present invention.
Figure 8:
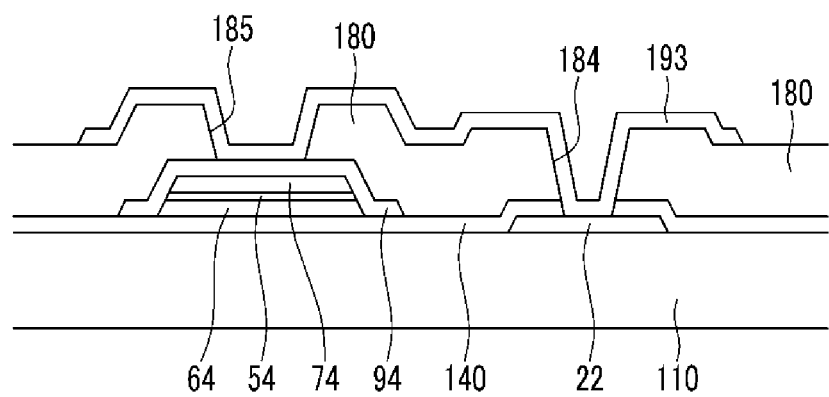
FIG. 8 is a cross-sectional view of the thin film transistor array panel of FIG. 7, taken along line VIII-VIII.

FIG. 5 is a layout view of a driving transistor of the driving unit of the thin film transistor array panel of the liquid crystal display, according to an exemplary embodiment of the present invention, and FIG. 6 is a cross-sectional view of the thin film transistor array panel of FIG. 5, taken along line VI-VI. FIG. 7 is a layout view showing a part of signal lines of the driving unit, and FIG. 8 is a cross-sectional view of the thin film transistor array panel of FIG. 7, taken along line VIII-VIII.

Referring to FIGS. 5 and 6, a driving control signal line 21 is formed over the first substrate 110. The driving control signal line 21 includes a driving control electrode 24. The driving control signal line 21 and the gate line 121 are simultaneously formed from the same layer.

The gate insulating layer 140 is positioned on the driving control signal line 21 and the driving control electrode 24. A driving semiconductor 51 is positioned on the gate insulating layer 140. The driving semiconductor 51 may include an oxide semiconductor. The driving semiconductor 51 and the semiconductor 154 may be simultaneously formed from the same layer.

A third barrier layer 61 and a fourth barrier layer 62 are formed on the driving semiconductor 51. A driving input signal line 71 and a driving signal line 72 are formed on the third barrier layer 61 and the fourth barrier layer 62. The driving input signal line 71 includes a driving input electrode 71a, and the driving output signal line 72 includes a driving output electrode 72a.

The driving input signal line 71 and the driving output signal line 72 may be formed at the same time as the driving semiconductor 51, the third barrier layer 61, and the fourth barrier layer 62, which are positioned under the driving input signal line 71 and the driving output signal line 72, using one mask. Further, the driving input signal line 71 and the driving output signal line 72 including the driving output electrode 72a may be simultaneously formed as the same layer as the data line 171 and the drain electrode 175.

A second protecting layer 92 is formed on the driving input signal line 71, and a third protecting layer 93 is formed on the driving output signal line 72. The second protecting layer 92 covers and protects the side and top surfaces of the driving input signal line 71, and the third protecting layer 93 covers and protects the side and top surfaces of the driving output signal line 72. The second protecting layer 92 and the third protecting layer 93 are simultaneously formed from the same layer as the first field generating electrode 191.

The passivation layer 180 is positioned over the second and third protecting layer 92 and 93 and the driving semiconductor 51. The passivation layer 180 may be disposed directly on the exposed portion of the driving semiconductor 51. As described above, the passivation layer 180 includes silicon oxide to prevent an oxygen deficiency of the driving semiconductor 51.

The driving semiconductor 51, the third barrier layer 61, the fourth barrier layer 62, the driving input line 71, and the driving output line 72 may be formed by one photolithography process using one exposure mask. The driving semiconductor 51 has substantially the same planar shape as the driving input line 71 and the driving output line 72, and the third barrier layer 61 and the fourth barrier layer 62.

The driving input signal line 71 and the driving output signal line 72 are made of a low resistance metal and are covered and protected by the second protecting layer 92 and the third protecting layer 93, which are made of a transparent conductor. Therefore, the driving input signal line 71 and the driving output signal line 72 do not directly contact the passivation layer 180. Therefore, it is possible to prevent oxidization which may occur when the data line 171, the source electrode 173, and the drain electrode 175, react with the passivation layer 180. Accordingly, it is possible to prevent corrosion caused by oxidation.

As shown in FIG. 6, the side surfaces of the driving input electrode 71a and the driving output electrode 72a are separated from each other and are covered and protected by the second protecting layer 92 and the third protecting layer 93. Therefore, a third distance LL1 between the driving input electrode 71a and the driving output electrode 72a is set to be larger than a fourth distance LL2 between the second protecting layer 92 and the third protecting layer 93. Therefore, the actual channel length of the driving semiconductor 51 corresponds to the fourth distance LL2, which is smaller than the third distance LL1 between the driving input electrode 71a and the driving output electrode 72a.

When one exposure mask is used to pattern the driving semiconductor 51, the third barrier layer 61, the fourth barrier layer 62, the driving input line 71, and the driving output line 72, it may be difficult to obtain a small distance between the driving input electrode 71a and the driving output electrode 72a. However, since the side surfaces of the driving input electrode 71a and the driving output electrode 72a are covered by the second protecting layer 92 and the third protecting layer 93, the actual channel length of the driving semiconductor 51 may be reduced. Accordingly, the performance of the driving semiconductor 51 may be improved.

Further, the driving input signal line 71 and the driving output signal line 72 are covered by the second protecting layer 92 and the third protecting layer 93. Therefore, if a defect occurs during a manufacturing process of the driving input signal line 71 and/of the driving output signal line 72, for example, the widths of the driving input signal line 71 and the driving output signal line 72 are reduced or a disconnection occurs, it is possible to repair the defect. That is, driving signals transmitted through the driving input signal line 71 and/or the driving output signal line 72 may be transmitted through the second protecting layer 92 and/or the third protecting layer 93. Therefore, a defect occurring during the manufacturing process may be repaired without an additional repair step.

Now, referring to FIGS. 7 and 8, a driving signal transmitting line of the driving region of the thin film transistor array panel will be described. Referring to FIGS. 7 and 8, a first driving signal transmitting line 22 is formed on the first substrate 110. The first driving signal transmitting line 22 may be simultaneously formed from the same layer as the gate line 121. The gate insulating layer 140 is positioned on the first driving signal transmitting line 22.

A second driving signal transmitting line 74 is positioned over the gate insulating layer 140. The second driving signal transmitting line 74 is simultaneously formed from the same layer as the data conductors, such as the data line 171 and the drain electrode 175. A dummy semiconductor 54 and a fifth barrier layer 64 are positioned under the second driving signal transmitting line 74. The dummy semiconductor 54 may include an oxide semiconductor, and may be simultaneously formed from the same layer as the semiconductor 154. The second driving signal transmitting line 74, the dummy semiconductor 54, and the fifth barrier layer 64 may be formed at the same time, using one mask.

A fourth protecting layer 94 is formed on the side and top surfaces of the second driving signal transmitting line 74. The passivation layer 180 is formed on the fourth protecting layer 94. As described above, the passivation layer 180 includes silicon oxide to prevent an oxygen deficiency of oxide semiconductor.

The passivation layer 180 and the gate insulating layer 140 have a second contact hole 184 exposing a part of the first driving signal transmitting line 22. The passivation layer 180 has a third contact hole 185 exposing a portion of the second driving signal transmitting line 74. A connecting member 193 is formed on the second and third contact holes 184 and 185. The connecting member 193 connects the first driving signal transmitting line 22 exposed through the second contact hole 184 to the second driving signal transmitting line 74 exposed through the third contact hole 185, so as to transmit a driving signal transmitted through the first driving signal transmitting line 22 to the second driving signal transmitting line 74, or to transmit a driving signal transmitted through the second driving signal transmitting line 74 to the first driving signal transmitting line 22.

The second driving signal transmitting line 74 of the driving unit is covered and protected by the fourth protecting layer 94. Therefore, the second driving signal transmitting line 74 does not directly contact the passivation layer 180 made of silicon oxide. Therefore, it is possible to prevent oxidization that may occur when the second driving signal transmitting line 74 reacts with the passivation layer 180. Accordingly, it is possible to prevent corrosion caused by oxidization.

In the above-described exemplary embodiments, it has been described that any one of two field generating electrodes overlapping each other, that is, any one of the first field generating electrode and the second field generating electrode has a plate shape, and the other has a branch portion. However, the present invention is not limited thereto, but may be applied to all types of thin film transistor array panels having two field generating electrodes in one array panel.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display comprising:
a substrate;
a gate line and a data line disposed on the substrate;
a semiconductor layer disposed on the substrate;
first and second field generating electrodes disposed on the substrate; and
a first protecting layer formed from the same material as the first field generating electrode and covering the data line,
wherein the first protecting layer comprises a transparent insulating layer having an indium oxide content that ranges from about 10 wt % to about 50 wt %, based on the total weight of the transparent insulating layer.

2. The liquid crystal display of claim 1, wherein the semiconductor layer comprises an oxide semiconductor.

3. The liquid crystal display of claim 2, further comprising an insulating layer covering the semiconductor layer and comprising silicon oxide.

4. The liquid crystal display of claim 3, further comprising:
a source electrode overlapping the semiconductor layer and connected to the data line; and
a drain electrode overlapping the semiconductor layer and facing the source electrode,
wherein the first protecting layer comprises a first portion covering the source electrode and a second portion covering the drain electrode.

5. The liquid crystal display of claim 4, wherein the minimum distance between the source electrode and the drain electrode is larger than the minimum distance between the first and second portions of the first protecting layer.

6. The liquid crystal display of claim 2, wherein the data line comprises a low-resistance metal selected from Cu, Al, Ag, or any alloys thereof.

7. The liquid crystal display of claim 2, wherein:
the substrate comprises a display area comprising pixels and a peripheral area disposed outside of the display area; and
the liquid crystal display further comprises:
a first signal transmitting line and a second driving signal transmitting line disposed in the peripheral area of the substrate; and
a second protecting layer formed from the same material as the first field generating electrode and covering at least a portion of the second driving signal transmitting line.

8. The liquid crystal display of claim 7, further comprising:
a driving semiconductor disposed in the peripheral area;
a driving input electrode and a driving output electrode, overlapping the driving semiconductor;
a third protecting layer covering the driving input electrode; and
a fourth protecting layer covering the driving output electrode,
wherein the third protecting layer and the fourth protecting layer are formed from the same material as the first field generating electrode.

9. The liquid crystal display of claim 8, wherein the minimum distance between the driving input electrode and the driving output electrode is larger than the minimum distance between the third protecting layer and the fourth protecting layer.

10. The liquid crystal display of claim 2, wherein the first field generating electrode and the second field generating electrode overlap each other with an insulating layer interposed therebetween.

11. The liquid crystal display of claim 10, wherein at least one of the first field generating electrode and the second field generating electrode comprises branch electrodes.

12. The liquid crystal display of claim 1, further comprising:
a source electrode overlapping the semiconductor layer and connected to the data line; and
a drain electrode overlapping the semiconductor layer and facing the source electrode,
wherein the first protecting layer comprises a first portion covering the source electrode and a second portion covering the drain electrode.

13. The liquid crystal display of claim 12, wherein the minimum distance between the source electrode and the drain electrode is larger than the minimum distance between the first and second portions of the first protecting layer.

14. The liquid crystal display of claim 1, wherein: the data line comprises a low resistance metal selected from Cu, Al, Ag, or any alloys thereof.

15. The liquid crystal display of claim 1, wherein:
the substrate comprises a display area comprising pixels and a peripheral area disposed outside the display area; and
the liquid crystal display further comprises:
a first signal transmitting line and a second driving signal transmitting line, disposed in the peripheral area of the substrate; and
a second protecting layer formed from the same material as the first field generating electrode and covering at least a portion of the second driving signal transmitting line.

16. The liquid crystal display of claim 15, further comprising:
a driving semiconductor disposed in the peripheral area;
a driving input electrode and a driving output electrode overlapping the driving semiconductor; and
a third protecting layer covering the driving input electrode; and
a fourth protecting layer covering the driving output electrode,
wherein the third protecting layer, the fourth protecting layer, and the first field generating electrode are formed from the same material.

17. The liquid crystal display of claim 15, wherein the minimum distance between the driving input electrode and the driving output electrode is larger than the minimum distance between the third protecting layer and the fourth protecting layer.

18. The liquid crystal display of claim 1, further comprising an insulating layer,
wherein the first field generating electrode and the second field generating electrode overlap each other with the insulating layer interposed therebetween.

19. The liquid crystal display of claim 18, wherein at least one of the first field generating electrode and the second field generating electrode comprises branch electrodes.

\* \* \* \* \*